United States Patent [19]

Schloss

[11] Patent Number: 4,839,884

[45] Date of Patent: Jun. 13, 1989

[54] MULTIPLE WAVELENGTH OPTICAL SOURCE AND MULTIPLEXED LIGHT COMMUNICATION SYSTEM

[75] Inventor: Robert P. Schloss, East Brunswick, N.J.

[73] Assignee: General Electric Company, Camden, N.J.

[21] Appl. No.: 165,066

[22] Filed: Mar. 4, 1988

[51] Int. Cl.$^4$ ............................................. H04B 9/00
[52] U.S. Cl. ...................................... 370/3; 350/172; 372/48; 455/606; 455/609; 455/617
[58] Field of Search ................. 350/96.18, 96.19, 170, 350/171, 172, 173; 372/18, 23, 38, 48, 49; 455/606, 607, 609, 610, 612, 613, 615, 617, 618; 370/3

[56] References Cited

U.S. PATENT DOCUMENTS

| | | | |
|---|---|---|---|
| 4,347,486 | 8/1982 | Botez | 372/46 |
| 4,641,311 | 2/1987 | Ackley | 372/18 |
| 4,642,143 | 2/1987 | Connolly et al. | 148/171 |
| 4,692,925 | 9/1987 | Botez | 372/46 |
| 4,700,339 | 10/1987 | Gordon et al. | 370/3 |
| 4,700,352 | 10/1987 | Shikada et al. | 455/609 |
| 4,708,422 | 11/1987 | Armoux et al. | 350/96.15 |
| 4,708,425 | 11/1987 | Gouali et al. | 370/3 |
| 4,709,371 | 11/1987 | West | 455/609 |
| 4,710,937 | 12/1987 | Oomori et al. | 372/53 |
| 4,712,220 | 12/1987 | Luft | 372/18 |
| 4,712,882 | 12/1987 | Baba et al. | 350/413 |
| 4,723,829 | 2/1988 | Koonen | 370/3 |
| 4,747,655 | 5/1988 | Shirasaki | 350/96.19 |

OTHER PUBLICATIONS

"Simple Structure High Isolation Multi/Demultiplex", Electronic Letters, vol. 16, #23, 11-6-88, pp. 869-870, Tanaka et al.

"Microoptic Grating Multiplexers and Optical Isolators for Fiber-Optic Communications", by Kobayashi et al., published in IEEE Journal of Quantum Electronics, vol. QE-16, No. 1, Jan. 1980.

"Applications of Grin-Rod Lenses in Optical Fiber Communication Systems", by Tomlinson, published in Applied Optics, vol. 19, No. 7, Apr. 1, 1980.

Primary Examiner—Robert L. Griffin
Assistant Examiner—Leslie Van Beek
Attorney, Agent, or Firm—Raymond E. Smiley

[57] ABSTRACT

An external-cavity laser includes low-level, broad spectrum light sources and plural light amplifiers. The external cavity includes a common partially reflecting mirror, and a common diffraction grating which couples the mirror to the light amplifiers. The feedback light is at a different wavelength for each amplifier, so that lasing takes place at plural wavelengths. The output light, while deriving from plural light amplifiers, occurs as a single light beam comprised of plural wavelengths.

17 Claims, 2 Drawing Sheets

MULTIPLE WAVELENGTH OPTICAL SOURCE AND MULTIPLEXED LIGHT COMMUNICATION SYSTEM

This invention relates to multiple-wavelength external-cavity optical sources and to light communication systems using such sources.

Modern communication systems require the capacity for extremely high data rates and for covering long distances. Earth satellite repeater systems fulfill at least a portion of this need, but Earth satellites have a high capital cost which is effectively increased because they are subject to sudden destruction by failure of the launch vehicle, they have relatively limited lifetime as a result of station-keeping fuel requirements, and they may suffer irreparable degradation as a result of amplifier or equipment failures.

Fiberoptic communication systems have the advantages of relatively low capita investment and relatively great bandwidth. The attenuation of fiberoptic cables is relatively low, so that long distances can be spanned without the use of repeaters. In general, fiberoptic communication systems have no significant degradation problems, which is attributable to the use of solid state light emitters and glass fiber conductors.

Various techniques have been developed for radio-frequency (i.e., non-optical) transmission systems for the transmission of plural signals, such as time division multiplexing (wherein a sequence of brief samples, each successive sample from a different signal until all the signals have been sampled, is used to modulate the radio-frequency carrier, after which a new sequence is started), frequency division mutiplexing (wherein each signal modulates a separate radio-frequency subcarrier, and the sum of all the modulated subcarriers is used to modulate the main radio-frequency carrier), and pulse code modulation (wherein each signal is sampled quickly, the value of the signal converted into a sequence of 1's and 0's, and the separate sequences, also called bit streams, are interleaved before modulation of the main radio-frequency carrier).

All of the multiplexing techniques developed for radio-frequency transmission systems can be used in fiberoptic communication systems. After all pre-processing (analog sampling, subcarrier modulation, analog-to-digital conversion and interleaving, etc.), the composite signal can be sent to the optical emitter for modulation as though the light were a radio-frequency carrier. It is also possible to use a modulated main carrier (the same signal that would go to a transmitting antenna, or come from a receiving antenna) and use it as input to the optical emitter.

While fiberoptic communication systems are very advantageous and low in cost, even greater capacity (ability to transmit large numbers of signals) can be obtained by multiplexing (combining) the outputs of plural sources (optical emitters) onto a single optical fiber, thereby reducing the number of optical fibers needed when only one optical emitter is used per fiber. This is made possible because the bandwidth of the fiber (ability to transmit light whose intensity is fluctuating rapidly) can be much greater than the bandwidth of the optical emitters (the fastest fluctuations in optical intensity that can be produced). As a prerequisite to combining the outputs of separate optical emitters onto a single optical fiber, it is necessary that each optical emitter be at a different wavelength, in order to distinguish between the output corresponding to each emitter.

For some applications, it may be advantageous to obtain a high brightness modulated or unmodulated optical source of incoherent radiation. The term brightness is technically defined as a standard measure of optical sources. Without regard to the spectral content of the optical source, brightness can be considered to be the power emitted in a particular direction divided by the area of the optical source. For example, the light emitted by the small filament in a lightbulb is very divergent; very little power is emitted in any particular direction. By the use of lenses, some of this light can be collected and concentrated, or collimated, so that a very large value of power is emitted in one direction; but the source, being the magnified image of the lightbulb filament, is greatly magnified. Thus, the brightness of the source is not increased by the use of optics.

The multiplexing of light beams of different wavelengths into a collinear beam is a method of obtaining higher brightness than can be obtained from a single source. In optical communications, the light beams are modulated. Apart from this, the multiplexing of unmodulated light beams produces a useful high brightness optical source. Such a source can be used for many purposes, such as exciting crystals doped with rare-earth elements used in certain kinds of lasers, or as a probe for spectroscopic analysis in which the absorption of specific wavelengths of the input radiation is used to infer the chemical content of an unknown sample.

In order to multiplex light signals onto a single optical fiber, light from plural sources must be combined into a singe light beam. Dichroic mirrors may be used to combine two light signals having different wavelengths so that they may be transmitted over an optical fiber or other optical path such as a free-space or free-air path to a receiver. At the receiver, a similar dichroic mirror may be used to separate the signals for individual detection.

A dichroic mirror reflects light at one wavelength while transmitting light at a different wavelength. Thus, if light beams at different wavelengths are made to intersect in a common region of space, then a dichroic mirror may be placed in that region, and the light beam at the wavelength for which the dichroic mirror reflects, may be made to be collinear with the light beam at the wavelength for which the dichroic mirror transmits. However, a dichroic mirror neither transmits a transmitted beam nor reflects a reflected light beam losslessly. Thus, dichroic mirrors introduce an attenuation which tends to reduce the magnitude or power of the transmitted signal, and which also tends to attenuate the received signals before they are applied to the light detectors. If additional third, fourth or more signals are to be multiplexed, additional dichroic mirrors must be added, with the attendant further attenuation. Moreover, every time a dichroic mirror is added in order to reflect an additional light beam collinear with the main beam, the incident main beam is made to pass through an additional optical element. Expansion of the number of multiplexed light beams therefore influences the transmitted power due to the existing light beams, with the greatest attenuation of the signals introduced earliest and passing through or reflecting from the largest number of mirrors.

U.S. Pat. No. 4,710,937 issued Dec. 1, 1987 to Oomori et al. describes an arrangement for multiplexing plural wavelengths into a single light beam. As described therein, a two-wavelength system includes two dye containers, two diffraction gratings, and two partially transmissive reflectors, while a three-wavelength system includes three dye containers, three partially transmissive reflectors, and three diffraction gratings. Light from the dye container most remote from the output passes in succession through each of the three partially transmissive reflectors and the other two dye containers, incurring attenuation at each passage.

It is desirable to reduce the attenuation inherent in the multiplexing of signals, so that three or more signals may be multiplexed or separated without passing through multiple mirrors or attenuators. The reduced attenuation at the transmitting and receiving ends may be used to increase the path length between the transmitter and receiver. It is also desirable that increasing the number of sources to be multiplexed should not impair the transmitted power transmitted due to the existing sources.

SUMMARY OF THE INVENTION

An optical apparatus for producing a beam of light having a plurality of discrete wavelengths includes a plurality of spaced-apart, substantially parallel light conducting channels extending between, orthogonal to, and terminating at reflecting and nonreflecting surfaces. The channels are formed from a material which, when energized, generates or accepts a broadband spectrum of low level light and which is capable of stimulated emission or amplification of the low level light and of radiating the amplified light in the form of divergent beams from the ends of the channels by way of the nonreflecting surface. The light beams are directed at slightly different angles toward a common region in space in which the light beams intersect. In one embodiment, a lens is used to converge spaced-apart light beams emerging from the channels. At least part of a diffraction grating is located within the common region of space where the light beams intersect. In another region of space, a partially reflective plane mirror is oriented at an angle relative to the grating. The grating is ruled and oriented for diffracting the light beams orthogonally toward the plane mirror. The light beams are partially reflected from the plane mirror back toward the diffraction grating, which re-diffracts the light back through the lens arrangement to the channels for re-amplification.

The wavelength of the stimulated emission from each channel is established by the requirement that the corresponding light beam be orthogonally incident on the plane mirror, since the light will then be directed back toward its source, which leads to optimal reinforcement of the emission. Since the channels are laterally separated, the lens arrangement directs the beam from each channel at a different incident angle onto the grating. In order for beams at different incident angles to diffract from the grating and still be orthogonal to the same plane mirror, each beam must be at a different wavelength. Each channel is therefore stimulated to emit light of a different wavelength.

In a particular embodiment of the invention, a plurality of information sources independently modulate a plurality of channels formed in a semiconductor block, so the individual light signals are independently modulated with the information signals. The light transmitted by the plane mirror traverses an optical path which may include an optical fiber. At the receiving end of the optical path, a second diffraction grating ruled in a manner similar to that of the first diffraction grating receives the wavelength multiplexed light signal and reflects the individual components at differing angles for producing separated modulated beams of light. Individual detectors respond to the individual beams of light for reproducing the information signals.

DESCRIPTION OF THE INVENTION

Figure 1A:
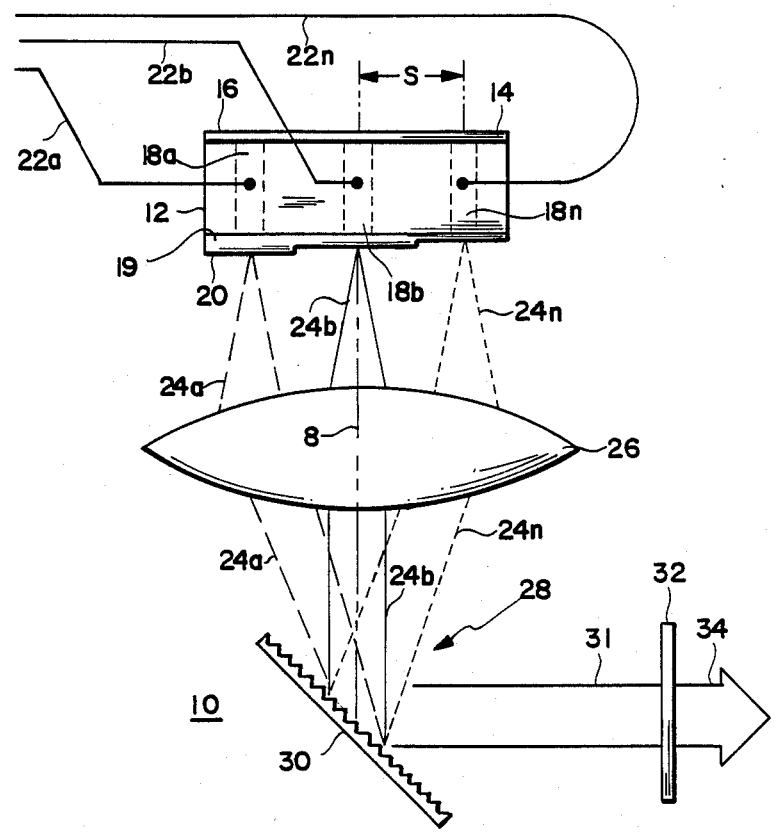
FIG. 1a is a simplified schematic representation of an optical source according to the invention for producing a single beam of light.

FIG. 1a illustrates a wavelength multiplexed light source designated generally as 10. Light source 10 includes a semiconductor body 12 in the form of a parallelepiped (seen in plan view in FIGURE 1a) including a rear surface 14 upon which is deposited a coating 16 and also including a front surface 19 upon which is deposited an antireflection coating 20. The index of refraction of semiconductor body 12 is greater than that of the surrounding medium, so that rear surface 14 is by nature a light reflecting surface. Coating 16 may be used to augment the reflectivity of rear surface 14, or may serve as a protective coating without altering the reflectivity of the surface. A plurality of elongated channels 18a, 18b . . . 18n are formed within semiconductor body 12 generally in the manner described in U.S. Pat. No. 4,692,925, issued Sept. 8, 1987 to Botez, and U.S. Pat. No. 4,641,311, issued Feb. 3, 1987, to Ackley. As described in these patents, semiconductor body 12 is doped and has layers deposited thereupon which define the light conducting channels 18 and which, together with two semi-reflective surfaces (not used in the arrangement of FIG. 1a), form an internal cavity laser. Instead of a two semi-reflecting surfaces as described in the above-mentioned patents, semiconductor body 12 has anti-reflective coating 20 on front surface 19, so that semiconductor body 12, together with its associated surfaces and coatings, does not by itself form a laser.

Each light-conducting channel 18 includes metal layers by which the semiconductor may be energized by an electrical signal to produce light. As illustrated in FIG. 1a, channel 18a is associated with a conductor 22a, channel 18b is associated with a conductor 22b, and channel 18n is associated with a conductor 22n. Each of the conductors provides independent access to the semiconductor in the region of the associated light-conducting channel 18. When energized, the semiconductor region about each channel generates a relatively low-intensity discharge of light over a broad spectrum of wavelengths. The semiconductor material, as known, is also capable of stimulation by light for reinforcing emission, which is known as light amplification. In the absence of feedback of some portion of the emission back into semiconductor body 12, however, semiconductor body 12 alone simply produces low amplitude, broadband (a broad spectrum of wavelengths) light beams from the ends of channels 18 by way of front surface 19 and anti-reflective coating 20. The light beam emitted by channel 18a is illustrated by dashed line 24a, the light beam produced by channel 18b is illustrated by solid lines 24b, and the light beam produced by channel 18n is illustrated by dotted line 24n.

Each channel 18 is spaced from the adjacent channel in the lateral direction by a distance S which is great enough to prevent phase locking of the emissions from the channels. Such phase locking is described in the aforementioned U.S. Pat. No. 4,692,925. A spacing S, suitable to prevent phase locking, may be 0.15 mm.

The divergence of the beam emanating from each of the channels 18 by way of front surface 19 and anti-reflective coating 20 depends upon the size in wavelengths of the radiating region. A typical beam may diverge so as to have a half-power beam width of 30° in a plane perpendicular to the plane of the paper of FIG. 1, and 10° in the plane of the paper. A collimating lens arrangement 26 which may be a simple lens has an overall diameter such as 50 mm, with a focal length of 50 mm, and is spaced approximately 50 mm from anti-reflective coating 20 to intercept beams of light 24a, 24b ... 24n. Lens arrangement 26 causes the beams of light to converge in space near a region 28, as illustrated in FIG. 1a. A diffraction grating 30 intercepts the beams of light in region 28. Such diffraction gratings are well known and are described in "Principles of optics; electromagnetic theory of propagation, interference and diffraction of light", 6th Edition, 1980, pg. 808 by M. Born and E. Wolf, and in "Introduction to modern optics", 2nd Edition, 1975, pg. 328 by G. R. Fowles.

Diffraction grating 30 diffracts the incident light beams 24 along a beam path 31 toward a semireflecting or semitransparent plane mirror 32. The diffraction is essentially a wavelength-dependent reflection. Plane mirror 32 transmits a portion of the light as a beam 34 directed into space to the right of mirror 32, and reflects a portion of the light back along path 31 toward diffraction grating 30. Diffraction grating 30 re-diffracts the light returning along path 31 from partially reflecting mirror 32, and as described below, directs the light back along the paths 24a, 24b ... 24n to the various channels 18 for reinforcing light emission at particular wavelengths. Thus, the light reflected from plane mirror 32 is the feedback portion which stimulates the laser emission of light.

The net optical gain produced in semiconductor body 12 and each light-conducting channel 18 is preferential for light polarized in the plane of the paper. The gain advantage of polarization in the plane of the paper over polarization out of the plane of the paper is slight in the case of a single pass through the semiconductor body 12, but over many regenerative round trips within light source 10, the polarization is polarized with great purity in the plane of the paper.

The angle $\alpha$ with which lens arrangement 26 causes light from a particular channel 18 to be incident upon diffraction grating 30 relative to a perpendicular to the grating is given by:

$$\alpha = \theta_o + \arctan \frac{x}{f} \quad (1)$$

where x is the lateral displacement of the particular channel 18 away from optical axis of lens arrangement 26, f is the focal length of lens arrangement 26, and $\theta_0$ is the inclination of the perpendicular to diffraction grating 30 with respect to the optical axis of lens arrangement 26.

The angle $\beta$ of light diffracted from diffraction grating 30 relative to a perpendicular to the grating is given by:

$$\sin \beta = \sin \alpha - \frac{\lambda}{\Lambda} \quad (2)$$

where $\alpha$ is the angle of the light incident upon diffraction grating 30, $\lambda$ is the wavelength of the light, and $\Lambda$ is the grating spacing.

In order for light emitted from a channel 18 with lateral displacement x away from the optical axis of lens arrangement 26 to be diffracted from diffraction grating 30 with angle $\beta$, it is necessary for it to have a wavelength $$\lambda(x) = \Lambda \left[ \sin \left( \theta + \arctan \frac{x}{f} \right) - \sin \beta \right] \quad (3)$$

The effect of the wavelength dependency of the reflection from diffraction grating 30 is such as to cause reinforcement of the stimulated emission from each of channels 18 at a different wavelength, which wavelength depends upon the rulings of diffraction grating 30 and upon the orientation of the diffraction grating relative to semiconductor body 12 and mirror 32. It should be emphasized that in operation there is no intentional interaction between any of the channels 18 and any adjacent channel, nor is there any significant feedback of light from any channel to the adjacent channels. Instead, the electrical energization of each channel and the properties of the material of which semiconductor body 12 is made provides the potential for feedback over a large range of wavelengths. However, for each channel, there is only one wavelength within this range for which the low-level light emitted from the channel is diffracted by diffraction grating 30 in a direction orthogonal to plane mirror 32, returns to the diffraction grating and is re-diffracted back to the channel for reinforcement of emission. For each channel, the wavelength at which reinforcement takes place differs, because the beam of light produced by that channel is incident upon diffraction grating 30 at a particular angle differing from the angle of incidence of beams of light from all other channels, and all the beams are diffracted from the diffraction grating at the same angle so as to form a common beam along beam path 31. The combination of semiconductor body 12 with its associated reflecting and anti-reflective coatings, lens 26, diffraction grating 30 and partially reflecting mirror 32 forms a plurality of external-cavity lasers with a common partially refective mirror 32. Each of the external-cavity lasers is associated with a different channel. Each of these separate lasers operates at a slightly different frequency or wavelength, but all have a common output beam 34 in which the different wavelengths of light are multiplexed.

This arrangement has the advantage that the light of each wavelength passes through, or is reflected, diffracted, or refracted by, the same number of optical elements, i.e., through lens 26, past grating 31, and through mirror 32. Thus, there is the potential for lower loss than in the arrangement of the aforementioned Oomori patent.

For an embodiment including three channels as illustrated in FIG. 1a separated by a spacing S of 0.75 mm, a lens 26 with 50 mm diameter and 50 mm focal length, spaced 50 mm from anti-reflective coating 20, and a diffraction grating 30 having rulings of 1000 lines/mm and oriented at an angle of 78.7° relative to the axis 8 passing through central channel 18b, and 11.3° relative to beam path 31, central channel 18b will operate at 7847Å, channel 18a will operate at 7816Å, and channel 18n will operate at 7875Å.

Channel 18a, as illustrated in FIG. 1a, is separated from channel 18n by 2S, corresponding to 1.5 mm. If five channels rather than three are to be included within the 1.5 mm overall or total separation between the end channels, so that the spacing S is 0.375 mm the wavelengths of operation of the two channels may be determined by interpolation.

Thus, the wavelengths of the light components of output beam 34 may be selected by energization of any one of the separate channels by way of conductors 22a, 22b ... 22n, or a wavelength multiplexed combined output light beam 34 may be produced by applying electrical signal to two or more of conductors 22. Naturally, each of the multiplexed components of output light beam 34 may be modulated in response to the information to be transmitted by controlling the energization applied to the associated channel 18 by way of conductors 22.

Figure 1B:
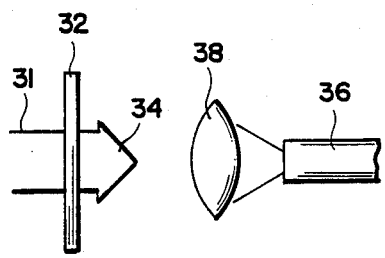
FIGS. 1b and 1c illustrate alternative arrangements by which the beam of light is coupled into a fiber optic cable.
Figure 1C:
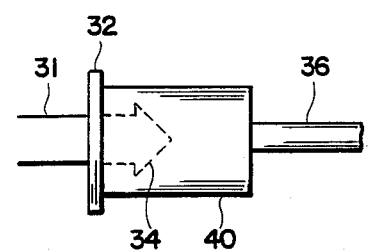

FIG. 1b illustrates an arrangement in which an optical fiber 36 is optically coupled by a lens 38 to partially reflecting mirror 32 for focusing output beam of light 34 into the optical fiber for transmission to a remote location. FIG. 1c illustrates a graded index lens 40 attached, as by cement, to the output side of partially reflecting mirror 32 and also attached to the end of optical fiber 36 for focusing light beam 34 into optical fiber 36. Graded index lenses have indices of refraction which are greatest near the optical axis, and are commercially available, for example under the tradename SELFOC from NSG America, whose address is 28 World's Fair Drive, Somerset, NJ 08873. A major advantage of the graded index lens is that it does not require space on each side of the lens.

Figure 2:
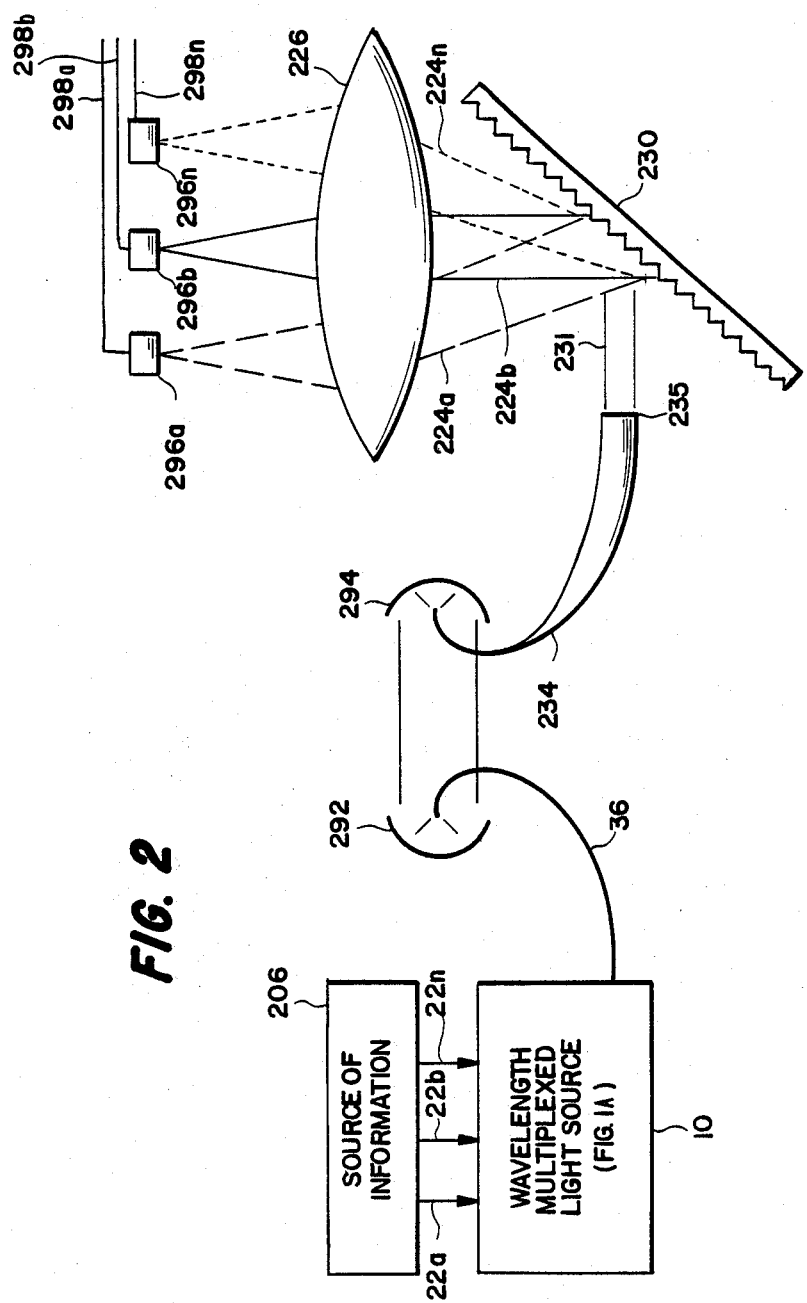
FIG. 2 is a simplified diagram, partially in block and partially in pictorial form, of a communication system in accordance with the invention.

FIG. 2 illustrates a communication system in accordance with an aspect of the invention. In FIG. 2, elements corresponding exactly to those of FIG. 1 are designated by the same reference numerals, and elements having a similarity are designated by the same reference numerals in the 200 series. In FIG. 2, a source of information illustrated as 210 is coupled by conductors 22a, 22b, and 22n to a wavelength multiplexed light source such as that illustrated in FIG. 1a, with the FIG. 1c alternative output configuration. Conductors 22a, 22b ... 22n may be connected to receive bits of various significance, as for example, conductor 22a may be connected to receive the most significant bit (MSB) and 22n connected to receive the least significant bit (LSB) of the information, with other conductors receiving bits of intermediate significance. Alternatively, the information on each conductor 22 may be totally independent. The information applied to each of conductors 22 independently modulates the external cavity laser 10 to produce a particular wavelength multiplexed component of light of beam 34 on output optical fiber 36. If two conductors 22 are alternately energized, the light of beam 34 in optical fiber 36 alternates wavelength, which corresponds to frequency shift keying (FSK). When two or more conductors 22 are simultaneously energized, beam 34 on optical fiber 36 is multiplexed.

Optical fiber 36 conducts the light from source 10 to a parabolic reflector 292, which directs the light through space to a receiving parabolic reflector 294. Reflector 294 focuses the received light into an optical fiber 234, which is illustrated partially in schematic and partially in pictorial form. A beam of light illustrated as 231 issues from the end 235 of optical fiber 234. Beam of light 231 carries or represents the received information, and may include several multiplexed wavelengths. Beam of light 231 is directed toward a diffraction grating 230, which is ruled in a manner identical to the ruling of diffraction grating 30 of FIG. 1a, and which is oriented relative to beam 231 at the same angle as diffraction grating 30 is oriented relative to beam path 31. Diffraction grating 230 and its relationship to light beam 231 may be seen to be analogous to diffraction grating 30 and light beam 31 returning from mirror 32 of FIG. 1a. Consequently, beams of light 224a (illustrated by dashed lines), 224b (illustrated by solid lines), and 224n (illustrated by dotted lines) are reflected at different wavelength-dependent angles from diffraction grating 230 and pass through a lens arrangement 226 corresponding to lens arrangement 26 of FIG. 1a, to produce separated beams of light which are applied individually to light detectors 296a, 296b, and 296n, respectively. Light detectors 296 may be PIN photo diodes or other types of detectors as known in the art. Detectors 296 produce information signals on conductors 298a, 298b ... 298n for use by utilization apparatus (not illustrated).

Other embodiments of the invention will be apparent to those skilled in the art. For example, the number of channels within semiconductor body 12 may be greater or less than 3, and may be an even number. The minimum value of spacing S may be selected at will so long as phase locking is avoided. The semiconductor body 12 may be constructed from several modules which differ in composition, such that the composition of the semiconductor body 12 in the vicinity of a channel 18 is optimized for the attendant wavelength of operation of the channel 18, when the lateral displacement of the channel 18 from the optical axis of lens arrangement 26 is considered. The thickness of anti-reflective coating 20 may be varied so as to be optimized for the operating wavelength of each channel, as illustrated by the steps in FIG. 1a. Lens arrangement 26 may be a multi-element lens assembly, and may include anti-reflective coatings.

The plane mirror may be curved, so long as a complementary curvature is introduced by the lens or grating so the conditions for lasing are fulfilled. The lens may collimate the individual beams as well as converge them to a conversion region of space. Many variations of type and orientation of diffraction grating 30 may be used, which may result in different operating wavelengths. These include selecting the grating spacing, the angle of diffraction grating 30 with respect to lens arrangement 26, the angle of plane mirror 32 with respect to diffraction grating 30, the choice of ruling profile determining by way of the diffraction efficiency which of the various possible diffraction orders will be used in operation. The modulation of a channel may be by an analog information signal as well as a digital information signal. The individual information signal used for the modulation of a channel may further be a result of electronically multiplexing plural information signals. The optical fibers may be single mode or multimode, or an intermixture.

What is claimed is:

1. An apparatus for producing light at a plurality of discrete wavelengths, comprising:

a semiconductor block including a light-reflecting surface and a plurality of spaced-apart substantially parallel light-conducting channels including first and second ends, said channels being orthogonal to and terminating at said first end at said reflecting surface, said semiconductor block being formed from materials which, when electrically energized, generate in said channels a broad spectrum of incoherent light, and which semiconductor block is capable of stimulated emission of light, for radiating light beams from said second ends of said channels;

a lens arrangement arranged for deceiving said light beams from said channels for directing said light beams from said channels at slightly differing angles toward a region of space;

a partially reflective plane mirror for partially reflecting back light which is directed orthogonally said plane mirror and for transmitting the remainder of said light;

a diffraction grating located at least in part within said region of space for receiving said light beams at said slightly differing angles, and oriented and ruled for diffracting said light beams orthogonally toward said plane mirror, whereby said light beams are partially reflected back from said plane mirror, toward said diffraction grating, and are diffracted by said diffraction grating back through said lens arrangement to said channels for stimulating light emission therefrom, the wavelength of the emission from each channel being established by the angle of incidence on said diffraction grating which results in orthogonal reflection from said plane mirror.

2. An apparatus according to claim 1 further comprising an anti-reflective coating adjacent said second ends of said plurality of light-conducting channels.

3. An apparatus according to claim 2 wherein said anti-reflective coating in the region of each channel has a thickness which varies in dependence upon said wavelength of emission from the associated channel.

4. An apparatus according to claim 1 further comprising an optical fiber coupled to said plane mirror for receiving said remainder of said light.

5. A wavelength-multiplexed communication system, comprising:

a source of first information to be transmitted;
a source of second information to be transmitted;
a semiconductor block including a light-reflective surface and at least first and second elongated, spaced-apart, parallel light-conducting channels, each including first and second ends, each of said channels being orthogonal to and terminating at said first ends at said reflective surface, said semiconductor block being formed from materials which, when energized, generate and coupe to said channels a broad spectrum of incoherent light, and which is capable of stimulated emission of light for radiating first and second light beams from said second ends of said first and second channels, respectively;

means coupled to said sources of first and second information and to said first and second channels for modulating said first and second light beams with said first and second information, respectively, to generate first and second modulated beams of light;

a lens arrangement arranged for receiving said modulated beams of light from said channels for directing said first and second modulated beams of light at slightly differing angles toward a common region of space;

a partially reflective plane mirror for partially reflecting back light which is directed orthogonal to said plane mirror, and for transmitting the remainder of said light so directed;

a diffraction grating located at least in part within said region of space for receiving said first and second modulated beams of light at slightly differing angles, said grating being oriented and ruled in a manner for diffracting said first and second light beams at first and second wavelengths, respectively, orthogonally toward said plane mirror, whereby said first and second modulated beams of light are partially reflected back from said plane mirror toward said diffraction grating, and are diffracted by said diffraction grating back through said lens arrangement to said first and second channels for stimulating emission at said first and second wavelengths, respectively, and whereby said first and second modulated beams of light at said first and second wavelengths, respectively, are partially transmitted by said plane mirror;

a light transmission path including an output for, together, translating to said output said first and second modulated beams of light which are transmitted by said plane mirror;

a receiving diffraction grating ruled identically to said first order diffraction grating, said receiving diffraction grating being coupled to said output of said transmission path for receiving said first and second modulated beams of light therefrom, and for diffracting said first and second modulated beams of light at differing angles depending upon said first and second wavelengths for producing separated first and second modulated beams of light;

first and second light detectors coupled to said receiving diffraction grating for individually receiving and responding to said separated first and second modulated beams of light for reproducing said first information from said first light detector and said second information from said second light detector.

6. A system according to claim 5 further comprising an anti-reflective coating adjacent said second ends of said plurality of light-conducting channels.

7. A system according to claim 6 wherein said anti-reflective coating in the region of each channel has a thickness which varies in dependence upon said wavelength of emission from the associated channel.

8. A system according to claim 5 wherein said light transmission path comprises an optical fiber optically coupled to said plane mirror for receiving said first and second modulated beams of light.

9. A system according to claim 5 wherein said light transmission path comprises a free space path.

10. A method for generating a beam of wavelength multiplexed light, comprising the steps of:

generating low-level light over a spectrum of wavelengths;
coupling said low-level light to first and second light channels, each of which is terminated in a mirror, for generating first and second separate beams of low-level light over a spectrum of wavelengths;
passing said separate beams of low-level light through an optical arrangement for causing said separate beams to converge in a region of space to form combined beams;

diffracting said combined beams in a direction by means of a diffraction grating to form a forward beam;

partially reflecting said forward beam to form a retrograde light portion and a transmitted light portion;

re-diffracting said retrograde light portion by means of said diffraction grating, whereby said retrograde light portion returns to said channels and results in lasing associated with each channel at a wavelength established at least n part by the ruling of said diffraction grating, and whereby said transmitted light portion is wavelength multiplexed; and coupling said wavelength multiplexed transmitted portion to utilization means 11. A method according to claim 10 wherein said generating step further comprises the step of modulating in response to an information signal.

12. An apparatus for producing light at a plurality of wavelengths, comprising:

a plurality of spaced-apart light conducting channels, each including first and second ends, each of said channels terminating at said first end in a reflecting surface, and each of said channels terminating at said second end in a light radiating surface, said channels being formed from materials which, when electrically energized, at least accept a broad spectrum of incoherent light, and which materials are capable of stimulated emission of light, said channels being optically arranged for radiating spaced-apart light beams from said second ends of said channels, which light beams are directed at slightly differing angles toward a region in space;

a partially reflective plane mirror for partially reflecting light which is directed orthogonally toward said plane and for transmitting the remainder of said light;

a diffraction grating located at least in part in said region in space for receiving said light beams directed at slightly differing angles, and oriented and ruled for diffracting said light beams orthogonally toward said plane mirror, whereby said light beams are partially reflected back from said plane mirror toward said diffraction grating, and are diffracted by said diffraction grating back to said light-conducting channels for stimulating light emission therefrom, the wavelength of the emission from each channel being established by the angle of incidence on said diffraction grating which results in orthogonal reflection from said plane mirror.

13. An apparatus according to claim 12, wherein said plurality of spaced-apart light conducting channels are parallel, and further including a lens arrangement located between said channels and said diffraction grating for directing said spaced-apart light beams at said slightly differing angles toward said region in space.

14. An apparatus according to claim 12, wherein each of said channels is arranged to optimize the light output at a particular wavelength near said wavelength established by said angle of incidence.

15. An apparatus according to claim 14, wherein each of said light conducting channels is formed principally in a semiconductor medium.

16. An apparatus according to claim 12, wherein each of said light conducting channels is formed principally in a semiconductor medium.

17. An apparatus according to claim 12, wherein more than one of said light conducting channels are formed within a block principally formed from semiconductor material.

* * * * *

UNITED STATES PATENT AND TRADEMARK OFFICE
CERTIFICATE OF CORRECTION

PATENT NO. : 4,839,884

DATED : June 13, 1989

INVENTOR(S) : Robert P. Schloss

It is certified that error appears in the above-identified patent and that said Letters Patent is hereby corrected as shown below:

Column 1, line 20, "capita" should be --capital--.

Column 6, line 53, "refective" should be --reflective--.

Column 9, line 13, "deceiving" should be --receiving--.

Column 9, line 18, after "orthogonally" insert --toward--.

Column 9, line 55, "coupe" should be --couple--.

Column 10, line 2, delete "common".

Column 11, line 12, "n" should be --in--.

Signed and Sealed this

Twenty-seventh Day of March, 1990

Attest:

JEFFREY M. SAMUELS

Attesting Officer

Acting Commissioner of Patents and Trademarks